(12) United States Patent
Ohashi et al.

(10) Patent No.: US 6,565,295 B2
(45) Date of Patent: May 20, 2003

(54) ENTRY BOARD FOR DRILLING

(75) Inventors: Yoshitaka Ohashi, Osaka (JP); Kikuko Matsuoka, Osaka (JP)

(73) Assignee: Risho Kogyo Co., Ltd., Osaka (JP)

( * ) Notice: Subject to any disclaimer, the term of this patent is extended or adjusted under 35 U.S.C. 154(b) by 16 days.

(21) Appl. No.: 09/866,777

(22) Filed: May 30, 2001

(65) Prior Publication Data

US 2002/0003991 A1 Jan. 10, 2002

(30) Foreign Application Priority Data

Jun. 5, 2000 (JP) ........................................ 2000-167778

(51) Int. Cl.$^7$ ............................................... B23B 41/00
(52) U.S. Cl. ........................ 408/87; 408/1 R; 428/458
(58) Field of Search ............................ 408/1 R, 72 R, 408/87, 241 R; 269/289 R; 428/606, 607, 650, 458, 459

(56) References Cited

U.S. PATENT DOCUMENTS

| | | | | |
|---|---|---|---|---|
| 4,162,932 A | * | 7/1979 | Konicek | |
| 4,311,419 A | * | 1/1982 | Block | |
| 4,853,273 A | * | 8/1989 | Harris | |
| 5,256,474 A | * | 10/1993 | Johnston | |
| 5,435,671 A | * | 7/1995 | Weinreich | |
| 5,480,269 A | * | 1/1996 | Ejiri et al. | |
| 5,716,168 A | * | 2/1998 | Janoff | |
| 5,785,465 A | * | 7/1998 | Korbonski | |
| 5,961,255 A | * | 10/1999 | Korbonski | |

FOREIGN PATENT DOCUMENTS

| | | |
|---|---|---|
| JP | 4-092488 | 3/1992 |
| JP | 10-217199 | 8/1998 |

* cited by examiner

Primary Examiner—William M. Pierce
(74) Attorney, Agent, or Firm—Wenderoth, Lind & Ponack, L.L.P.

(57) ABSTRACT

An entry board for drilling improves drill machinability such as hole positional accuracy using a fine-diameter drill, and roughness of the walls of the drilled holes. The entry board has a metallic foil, and a thermosetting resin is covered on one or both sides of the metallic foil to provide a drill-penetrating layer.

7 Claims, 1 Drawing Sheet

ENTRY BOARD FOR DRILLING

BACKGROUND OF THE INVENTION

This invention relates to a jig plate for holding a printed wiring board while it is drilled, i.e. an entry board for drilling.

Heretofore, as materials for entry boards for drilling, aluminum plates and paper-substrate phenolic resin laminated plates have been ordinarily used.

Also, a paper-substrate phenolic resin laminated board having a lubricant dispersed (Japanese patent publication 10-217199) to improve drill machinability and a composite sheet in which a sheet of water-soluble lubricant which is solid at normal temperature is laminated on one side of a metallic foil (Japanese patent publication 04-92488) are known.

An entry board in the form of an aluminum plate can be used for drilling a hole of a diameter of 0.35 mm or over without problems. For recently increasing drilling of a hole having a very small diameter of 0.30 mm or under, however, since the drill is thin and the drill strength is low, it is difficult to hold the drill on the surface of the aluminum plate, so that the drill tends to slip on the surface of the aluminum plate and it is liable to snap. Productivity thus markedly drops.

Also, an entry board in the form of a paper-substrate phenolic resin laminated plate is better in the drill holdability than an aluminum plate, and thus even small-diameter drills snap less frequently. But recently when drilling with narrow hole intervals is required, since inner paper fibers hinder advancement of the drill, there is a problem that the positional accuracy of holes using a small-diameter drill is insufficient.

Also, with an entry board which is a paper-substrate phenolic resin laminated plate in which is dispersed a lubricant, as disclosed in Japanese patent publication 10-217199, while effects are observed in improvement in roughness of the inner walls of machined holes and less wear of drills, recently when drilling with narrow hole intervals is required, there is a problem that the positional accuracy of holes using a small-diameter drill is insufficient.

Further, with an entry board in the form of a composite sheet in which a sheet of water-soluble lubricant which is solid at normal temperature is laminated on one side of a metallic foil as disclosed in Japanese patent publication 04-92488, there is no lowering in roughness of the inner walls of machined holes and less wear of drills due to the use of a water-soluble lubricant, and there is no bending of drills because the drill resistance is low during cutting. Also, the positional accuracy of machined holes using a fine-diameter drill improves.

But conversely, since the water-soluble lubricant is sensitive in the change between solid and liquid, if heat/water (including moisture absorption) is added, it melts easily. Conversely if it is cooled or water content is gone, it changes to a solid. Thus, if temperature/moisture control is poor during transportation or storage, solidification can arise.

Also, according to drilling conditions, water-soluble lubricant will mix into discharged chips. When it is cooled at the environmental temperature during discharge, it will solidify easily. Thus, depending on the circumstances, the discharge port might be clogged due to solidifying of the chips that gradually deposits at the root of the drill. Thus subsequent chips will not come out, thus causing snapping of the drill. Also, since the resin layer instantaneously melts due to heat buildup during drilling, it does not serve to retain the drill, so that retaining of the drill is carried out by the underlying metallic layer. Thus, like a conventional entry board made from an aluminum plate, chamfer is not improved.

An object of this invention is to improve, in an entry board for drilling, drill machinability such as positional accuracy using a fine-diameter drill.

SUMMARY OF THE INVENTION

According to the present invention, there is provided an entry board for drilling, the entry board comprising a metallic foil and a thermosetting resin covered on at least one side of the metallic foil to provide a drill-penetrating layer or layers.

FIG. 1 shows an embodiment in which a layer 2 of thermosetting resin as a drill penetrating layer is covered on one side of a metallic foil 1, and FIG. 2 shows an embodiment in which a layer 2 of a thermosetting resin as a drill penetrating layer is covered on both sides of a metallic foil 1.

As the thermosetting resin which provides a drill penetrating layer, one may be used which contains at least one of an epoxy resin and a phenolic resin and to which is added a thickening agent.

Also, a lubricant may be dispersed in a thermosetting resin to be used for covering. With a thermosetting resin, a sheet of a uniform thickness is obtained, and by laminating a metallic foil, handling properties improve. With a thermosetting resin as the drill penetrating layer or layers, slipping of a drill is restrained, and drill retainability and stability to heat buildup during drilling are good, so that good machinability with a fine drill is obtained.

As the thermosetting resin, an epoxy resin, phenolic resin, melamine resin, urea resin, etc. may be used. Among them, by using at least one of epoxy resin and phenolic resin, a heat-resistant, economical sheet is obtained.

A thickening agent is used for the purpose of making the formation of film easy. As thickening agents that will not pose any problems in drill machinability, polyvinyl acetal resin, synthetic rubber, etc. which are organic high-molecular thickening agents, or silica of 0.1 $\mu$m or less, which is an inorganic thickening agent may be used. Among them, a polyvinyl acetal resin is the easiest to use. For example, a thermosetting resin containing 10–60 wt % of a high-molecular polyvinyl acetal resin having an average polymerization degree of 1000–3000 may be used. If its content is 10 wt % or under, lowering in viscosity of the resin during forming is remarkable, so that adjustment to a uniform thickness is difficult. If 60 wt % or over, due to heat buildup during drilling, the resin would become too soft to retain the drill. Thus 10–60 wt % is a preferable range.

It is preferable to use an aluminum foil of 20–100 $\mu$m as the metallic foil, and cover a thermosetting resin so that the overall thickness is 40–250 $\mu$m. The range 40–250 $\mu$m is suitable to increase the drill machinability. If it is less than 40 $\mu$m, the drill retaining layer would become too thin, so that the positional accuracy of machined holes is lowered. If it exceeds 250 $\mu$m, the thickness of the entry board would be too thick. Since the edge length of a drill used for fine-diameter drilling is short, the number of boards machined in actual machining is limited, so that production efficiency lowers.

As the metallic foil, any metallic foil may be used so long as it imposes a low load on the drill. But in view of cost and uniformity in thickness, an aluminum foil is the most preferable. If aluminum foil is used, one with a thickness of 20–100 μm is suitable. If below 20 μm, handling properties of the thermosetting resin-covered sheet would be poor. Conversely, if over 100 μm, the load on the drill would be large, which may cause snapping of the drill.

Also, by using a thermosetting resin for the drill penetrating layer, hole machining is possible with good positional accuracy of machined holes. But if machining is required taking the wall surface roughness of machined holes into account, a lubricant may be added. The lubricant is not specifically limited if mixing in the thermosetting resin sheet is possible. As the lubricant, a higher alcohol or its derivative may be used.

Other features and objects of the present invention will become apparent from the following description made with reference to the accompanying drawings, in which:

DETAILED DESCRIPTION OF THE PREFERRED EMBODIMENT

EXAMPLE 1

Figure 1:
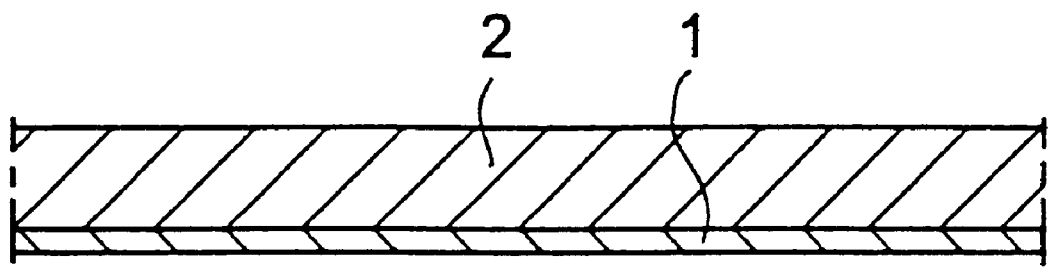
FIG. 1 is a sectional view showing an embodiment of an entry board for drilling according to this invention.
Figure 2:
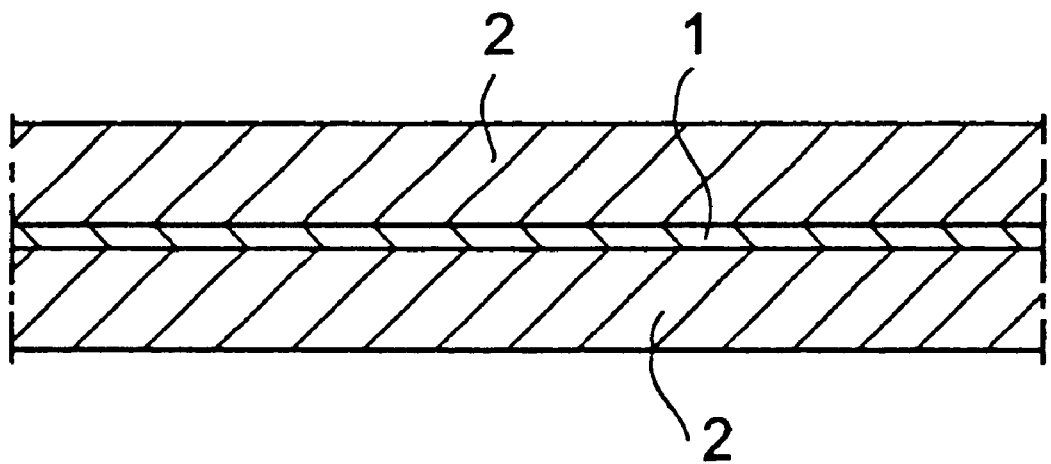
FIG. 2 is a sectional view showing another embodiment.

Drilling was carried out by use of an entry board which had a 50 μm thick aluminum foil laminated on one side of a resin sheet having a thickness of 100 μm and formed of a thermo setting resin which was comprised of 20 wt % of a polyvinyl acetal resin, 40 wt % of an epoxy resin, and 40 wt % of a phenolic resin.

EXAMPLE 2

Drilling was carried out by use of an entry board which had a 50 μm thick aluminum foil laminated on one side of a resin sheet having a thickness of 100 μm and formed of a thermo setting resin which was comprised of 20 wt % of a polyvinyl acetal resin, 40 wt % of an epoxy resin, and 40 wt % of a phenolic resin with 10 parts of a polyethylene glycol added as a lubricant.

Drilling was carried out using a 150 μm thick aluminum plate as an entry board.

Drilling was carried out by use of an entry board which was a resin sheet having a thickness of 100 μm and formed of a thermosetting resin which was comprised of 90 wt % of a polyvinyl acetal resin, 5 wt % of an epoxy resin, and 5 wt % of a phenolic resin.

COMPARATIVE EXAMPLE 3

A phenolic resin was applied to a paper having a basic weight of 200 g/m², and it was dried to obtain a prepreg sheet having a resin rate of 40%. Drilling was carried out using a paper-substrate phenolic resin laminated plate obtained by laminating two such prepreg sheets and subjecting them to heat/pressure forming at a temperature of 150° C. and a pressure of 100 kg/cm² for 60 minutes.

The results of drill tests for the Examples and the Comparative Examples are as shown in Table 1.

Drilling Conditions

Boards machined: 0.2 mm FR-4, 6-sheets laminated
Backup board: 1.5 mm thick paper-substrate phenolic resin laminated plate
Drill: 0.3 mm dia.
Number of revolutions: 80000 rpm
Feed: 20 μm/rev
Number of shots: 4000 shots

Evaluation Method

Maximum hole position displacement: Displacement between the machined hole position on a board on the backup board side and the preset hole position was confirmed to determine the maximum displacement.

Chip dischargeability: Checked whether chips remained in the drilled holes.

Roughness of walls of drilled holes: The wall roughness of machined holes at 3994–4000-shot positions of the board on the backup board side was measured by a cross-section method, and the average value was determined.

Since the entry board for drilling according to this invention comprises a uniform thermosetting resin at its drill-penetrating side, after a drill has penetrated, resistance to the drill at the layer of thermosetting resin is uniform, so that straight advance is possible. The positional accuracy of the holes is thus high.

Also, since the resin used is a thermosetting resin, it is stable for heat buildup of the drill and can retain the drill when it bites, so that good hole positional accuracy can be obtained.

TABLE 1

|  | Example 1 | Example 2 | Comp. ex. 1 | Comp. ex. 2 | Comp. ex. 3 |
| --- | --- | --- | --- | --- | --- |
| Max. hole position displacement (μm) | 28 | 30 | 55 | 51 | 50 |
| Chip dischargeability | good | good | good | good | good |
| Roughness of hole wall (μm) | 10 | 6 | 18 | 15 | 15 |

What is claimed is:

1. An entry board for drilling, said entry board comprising:
   an aluminum foil layer having first and second opposite surfaces; and
   a drill-penetrating layer provided on said first surface of said aluminum foil layer;
   wherein said drill-penetrating layer is formed of a thermosetting resin containing an epoxy resin, a phenolic resin and 10–60 wt % of a high-molecular polyvinyl acetal resin having an average polymerization degree of 1000 to 3000 as a thickening agent.

2. The entry board as claimed in claim 1, wherein
   said aluminum foil layer has a thickness of 20–100 μm;
   said entry board has an overall thickness of 40–250 μm; and
   a lubricant is dispersed in said drill-penetrating layer.

3. The entry board as claimed in claim 2, further comprising
   a second drill-penetrating layer provided on said second surface of said aluminum foil layer;
   wherein said second drill-penetrating layer is formed of a thermosetting resin containing an epoxy resin, a phenolic resin and 10–60 wt % of a high-molecular polyvinyl acetal resin having an average polymerization degree of 1000 to 3000 as a thickening agent.

4. The entry board as claimed in claim 1, further comprising
a second drill-penetrating layer provided on said second surface of said aluminum foil layer;
wherein said second drill-penetrating layer is formed of a thermosetting resin containing an epoxy resin, a phenolic resin and 10–60 wt % of a high-molecular polyvinyl acetal resin having an average polymerization degree of 1000 to 3000 as a thickening agent.

5. The entry board as claimed in claim 1, wherein said aluminum foil layer has a thickness of 20–100 $\mu$m.

6. The entry board as claimed in claim 1, wherein said entry board has an overall thickness of 40–250 $\mu$m.

7. The entry board as claimed in claim 1, wherein a lubricant is dispersed in said drill-penetrating layer.

* * * * *